(12) United States Patent
Anderson et al.

(10) Patent No.: US 10,074,570 B2
(45) Date of Patent: Sep. 11, 2018

(54) 3D VERTICAL FET WITH TOP AND BOTTOM GATE CONTACTS

(71) Applicant: INTERNATIONAL BUSINESS MACHINES CORPORATION, Armonk, NY (US)

(72) Inventors: Brent A. Anderson, Jericho, VT (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/676,461

(22) Filed: Aug. 14, 2017

(65) Prior Publication Data

US 2018/0197788 A1 Jul. 12, 2018

Related U.S. Application Data

(62) Division of application No. 15/403,297, filed on Jan. 11, 2017.

(51) Int. Cl.

| | |
|---|---|
| H01L 29/66 | (2006.01) |
| H01L 21/8234 | (2006.01) |
| H01L 27/088 | (2006.01) |
| H01L 23/48 | (2006.01) |
| H01L 23/00 | (2006.01) |
| H01L 21/768 | (2006.01) |
| H01L 29/78 | (2006.01) |
| H01L 23/535 | (2006.01) |
| H01L 29/423 | (2006.01) |

(52) U.S. Cl.
CPC ........ *H01L 21/823475* (2013.01); *H01L 21/76895* (2013.01); *H01L 23/481* (2013.01); *H01L 23/535* (2013.01); *H01L 24/17* (2013.01); *H01L 27/088* (2013.01); *H01L 29/42356* (2013.01); *H01L 29/66666* (2013.01); *H01L 29/7827* (2013.01)

(58) Field of Classification Search
CPC ....... H01L 21/823475; H01L 21/76895; H01L 23/535; H01L 29/7827; H01L 29/66666; H01L 24/17; H01L 23/48; H01L 27/088; H01L 29/42356
USPC ........................................................ 257/329
See application file for complete search history.

(56) References Cited

U.S. PATENT DOCUMENTS

| | | | |
|---|---|---|---|
| 6,268,621 B1 | 7/2001 | Emmi et al. | |
| 7,052,941 B2 * | 5/2006 | Lee .................. | B82Y 10/00 257/E27.026 |
| 7,749,905 B2 | 7/2010 | Cohen et al. | |
| 7,858,513 B2 | 12/2010 | Mohapatra et al. | |

(Continued)

OTHER PUBLICATIONS

List of IBM Patents or Patent Applications Treated as Related dated Aug. 14, 2017, 2 pages.

*Primary Examiner* — Vu A Vu
(74) *Attorney, Agent, or Firm* — Tutunjian & Bitetto, P.C.; Vazken Alexanian

(57) ABSTRACT

A semiconductor device includes a vertical transistor having a gate structure disposed about a channel region thereof. The vertical transistor has a top side above the gate structure and a bottom side below the gate structure. The top side includes metallization structures having a connection to the vertical transistor on the top side. The bottom side includes metallization structures having a connection to the vertical transistor on the bottom side, and the bottom side includes a power rail and a ground rail.

20 Claims, 9 Drawing Sheets

(56) References Cited

U.S. PATENT DOCUMENTS

| | | |
|---|---|---|
| 8,637,849 B2 | 1/2014 | Deligianni et al. |
| 9,356,043 B1 | 5/2016 | Sakakibara et al. |
| 9,379,238 B2 | 6/2016 | Larrieu |
| 2006/0289861 A1* | 12/2006 | Correale, Jr. ....... H01L 27/0207 257/48 |
| 2010/0148224 A1 | 6/2010 | Zhao |
| 2015/0370947 A1* | 12/2015 | Moroz ................ G06F 17/5072 716/119 |
| 2016/0087059 A1 | 3/2016 | Hsieh et al. |
| 2016/0190312 A1 | 6/2016 | Zhang et al. |

* cited by examiner

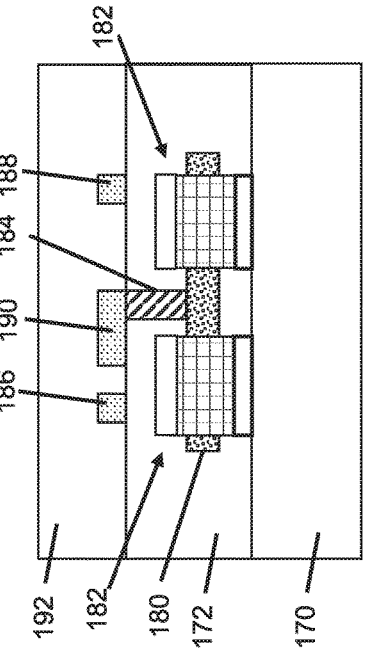
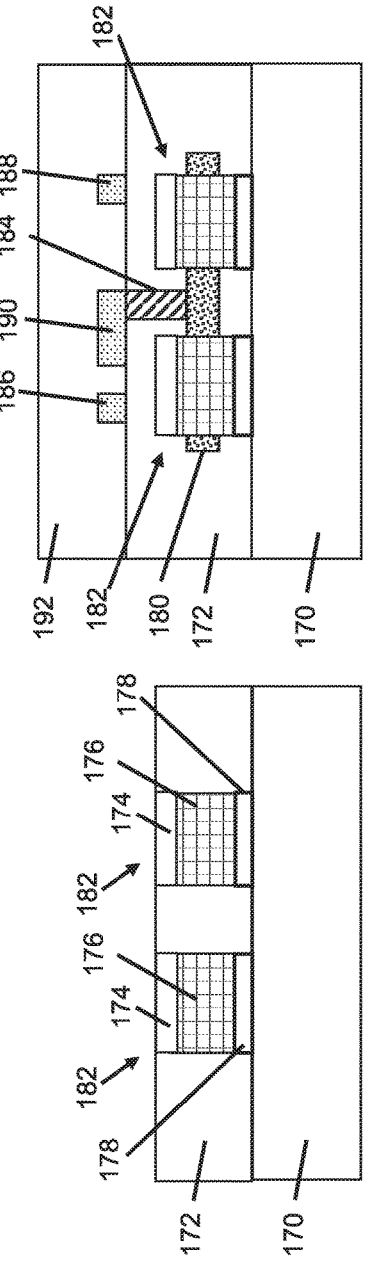
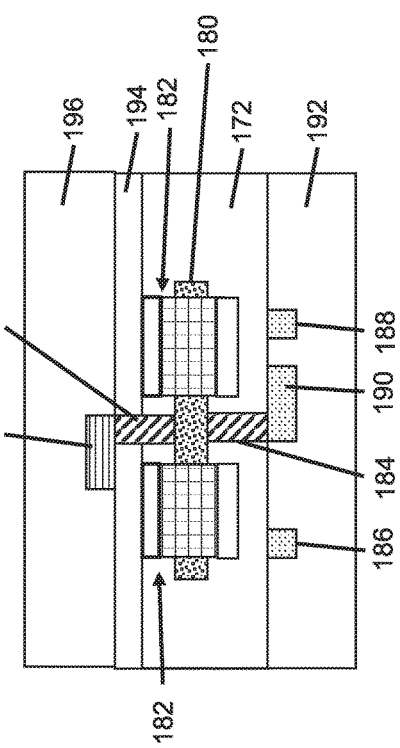

3D VERTICAL FET WITH TOP AND BOTTOM GATE CONTACTS

BACKGROUND

Technical Field

The present invention generally relates to vertical transport field effect transistors (VFETs), and more particularly to VFETs with power and ground bussing moved below the VFETs and wiring supported on both top and bottom of the VFETs.

Description of the Related Art

Standard cell libraries are a collection of electronic logic functions, such as AND, OR, INVERT, buffers, flip-flops, latches, etc. These cells include fixed-height, variable-width full-custom cells. When the widths are adjusted for narrow designs, a narrow track library is needed to fit the cell. These libraries include fixed heights, which enables the devices to be placed in rows to simplify design and fabrication. Narrow track libraries are extremely difficult to wire circuits without losing density. Distribution and wiring of power and ground can block wiring tracks and add extra metallization levels. The extra metallization levels can interfere with other components, can suffer from cross-talk or capacitance issues, can increase resistance, can contribute to design complexity, etc.

Therefore, a need exists for better utilization of chip area and height by providing simplified power and ground rails and including top and bottom wiring to enable higher chip density and address the disadvantages of narrow track cells.

SUMMARY

In accordance with an embodiment of the present invention, a semiconductor device includes a vertical transistor having a gate structure disposed about a channel region thereof. The vertical transistor has a top side above the gate structure and a bottom side below the gate structure. The top side includes metallization structures having a connection to the vertical transistor on the top side. The bottom side includes metallization structures having a connection to the vertical transistor on the bottom side, and the bottom side includes a power rail and a ground rail.

A semiconductor device includes vertical transistors sharing a same gate structure. The vertical transistors have a channel region and source and drain regions disposed above and below the channel region. The vertical transistors form a plane to provide a top side region above the plane and a bottom side below the plane. Top side metallization structures are formed above the plane and include one or more connections to the vertical transistors and the gate structure. Bottom side metallization structures are formed below the plane and include one or more connections to the vertical transistors and the gate structure. A power rail is formed below the plane, and a ground rail is formed below the plane.

A method for forming a semiconductor device includes forming vertical transistors on a substrate; forming a gate structure disposed about a channel region of the vertical transistor, the vertical transistor having a top side and a bottom side; forming bottom side metallization structures having at least one connection to the vertical transistor on a bottom side, the bottom side metallization structures including a power rail and a ground rail; removing the substrate from the vertical transistors; and forming top side metallization structures by flipping the device, the top side metallization structures having at least one connection to the vertical transistors on a top side.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 7A is a cross-sectional view of a device having vertical transistors formed on a substrate in accordance with an embodiment of the present invention;

FIG. 7B is a cross-sectional view showing bottom connections formed on one side of the device of FIG. 7A in accordance with an embodiment of the present invention;

FIG. 7C is a cross-sectional view showing top connections formed on the other side of the device of FIG. 7B after flipping the device in accordance with an embodiment of the present invention;

DETAILED DESCRIPTION

Figure 1:
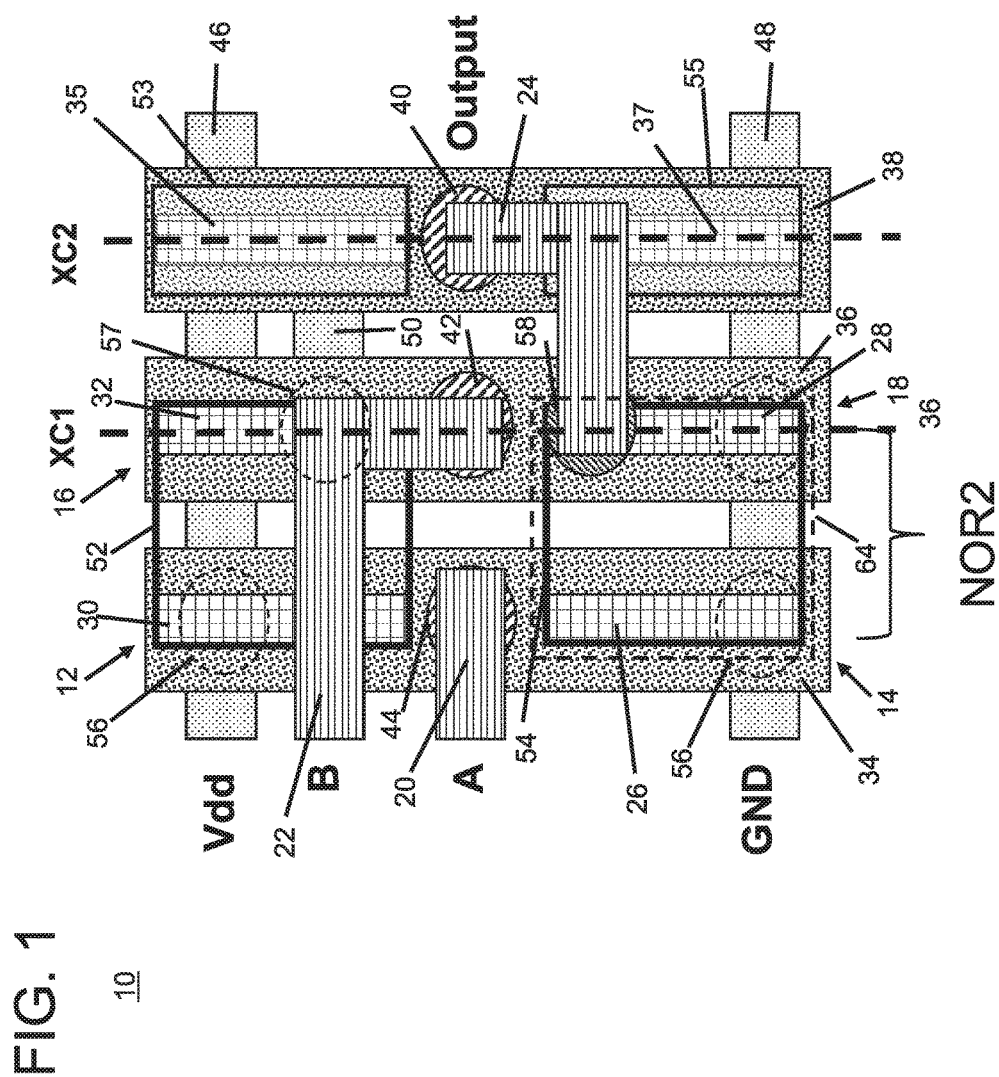
FIG. 1 is a layout view showing a five-track NOR2 gate device having top and bottom connections and supply and ground rails formed below vertical transistors in accordance with an embodiment of the present invention.

In accordance with embodiments of the present invention, vertical transport field effect transistors (VFETs) are provided that include power and ground bussing moved to a lower level of a chip and wiring is supported on both above and below a level of the VFET structure. Higher device density can be achieved to support power and ground simplification by using gate contacts from both top and bottom wiring channels.

In one embodiment, power and ground rails are buried within the device. This can include forming power and ground busses within a substrate or building layers below a substrate. In some embodiments, the vertical devices are repositioned with a layout to permit access from above and below the rails. In one embodiment, the layout may include access to the power and ground rails through a backside of a semiconductor substrate.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises." "comprising." "includes" and/or "including." when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower." "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 2:
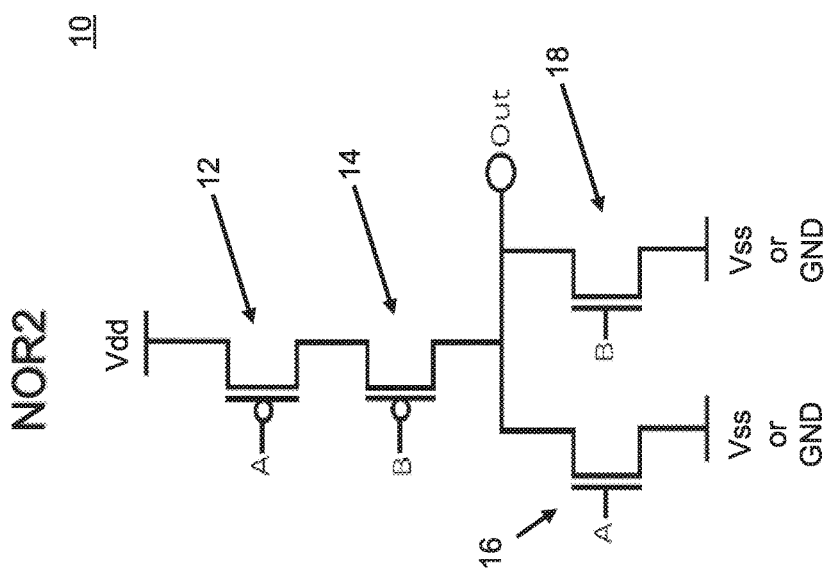
FIG. 2 is a schematic diagram showing the NOR2 circuit of the device in FIG. 1 in accordance with an embodiment of the present invention.
Figure 3:
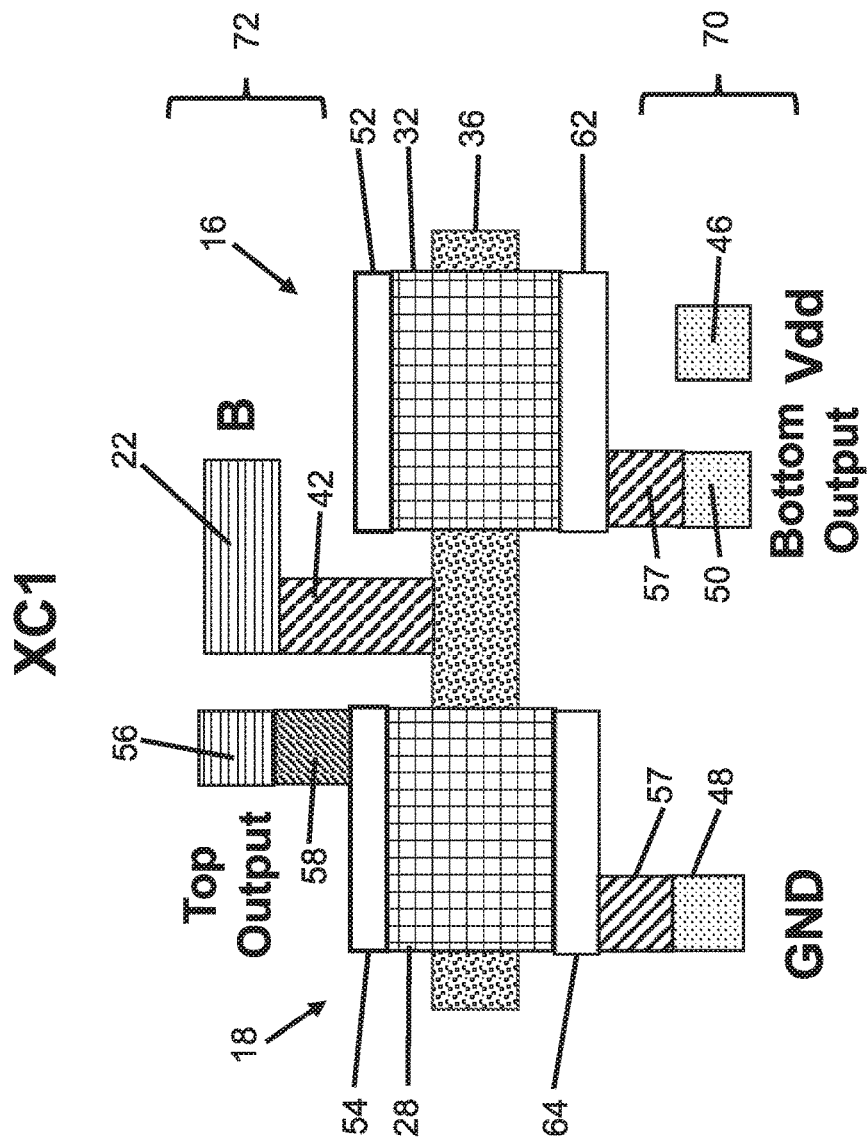
FIG. 3 is a cross-sectional view taken at section line XC1 of FIG. 1 showing top and bottom connections and supply and ground rails formed below the vertical transistors in accordance with an embodiment of the present invention.
Figure 4:
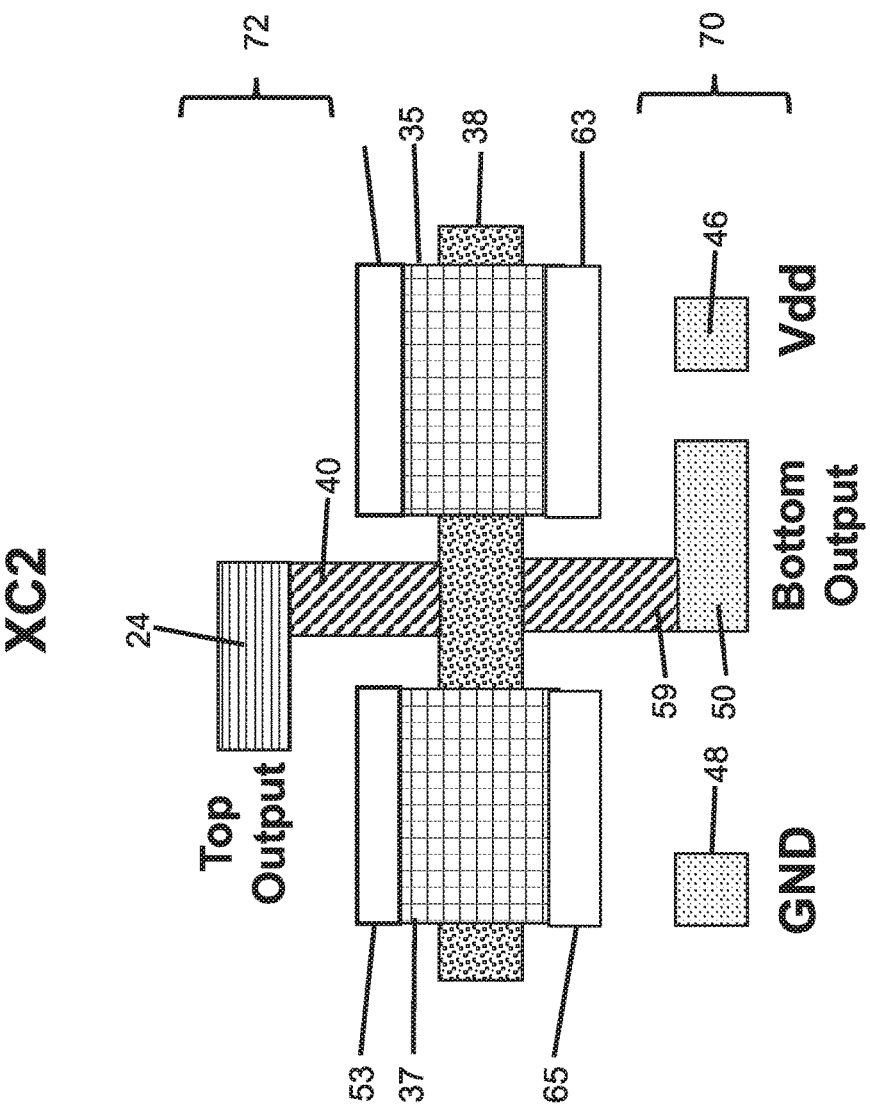
FIG. 4 is a cross-sectional view taken at section line XC2 of FIG. 1 showing top and bottom connections including top and bottom gate contacts and supply and ground rails formed below the vertical transistors in accordance with an embodiment of the present invention.

Referring now to the drawings in which like numerals represent the same or similar elements and initially to FIGS. 1 and 2, an illustrative layout 10 of a two input NOR gate (NOR2) is depicted to show top and bottom connections to components in a semiconductor layout. It should be understood that some components are transparently depicted or depicted in dashed lines in order to provide clarity. The layout 10 includes four field effect transistors (FETs) 12, 14, 16, 18, which include vertical finFETs in this example. The FETs 12, 14, 16, 18 include a vertical channel formed in fins 30, 26, 32, 28, respectively. The fins 30, 26, 32, 28 include source and drain (S/D) regions above (e.g., S/D regions 52, 54, which respectively connect fins 30 and 32, and fins 26 and 28) and S/D regions below (e.g., S/D regions 62, 64 (shown in dashed lines), which respectively connect fins 30 and 32, and fins 26 and 28). S/D regions are illustratively depicted for fins 35 and 37, which include S/D regions 53 and 55 above the fins 35 and 37. S/D regions 62, 63 and 65 are not shown in FIG. 1, but are depicted in FIGS. 3 and 4.

Gate structures 34, 36 and 38 are formed about the fins 30, 26, 32, 28, 35 and 37. The gate structures 34, 36, 38 are activated through gate contacts 44, 42, 40, respectively. The gate contacts 44, 42, 40 are connected to top metal lines 20, 22, and 24 respectively. Metal line 20 forms an input A for the NOR 2 device, and metal line 22 forms an input B for the NOR2 device. The metal line 24 connects to or forms an output (Output) of the NOR2 device and further connects to FET 18 by a top contact 58.

The gate structures 34, 36, 38 and the FETs 12, 14, 16, 18 are formed over another level of metal and contact connections (bottom connections). The bottom connections can include a power (Vdd) rail 46, a ground (GND or Vss) rail 48, other rails, metal lines 50, contacts 56, 57, and any other wiring components. By forming the bottom connections, greater chip area can be achieved and device thicknesses can be maintained. Having metal layers above and below the vertical FETs 12, 14, 16, 18 results in metal connections being closer and permitting the use of the additional height to increase metal line heights to reduce resistance.

The layout 10 includes a 5-track layout. This implies the usage of a standard wire pitch for a standard cell library. The 5-track layout efficiently realizes an entire two input NOR gate by taking advantage of both top and bottom connection layers. The five tracks include rail 46, input B (line 22), input A, (line 20), contact 58 and a horizontal portion of line 24 and rail 48. For example, inputs A and B and output "Output" are formed in a top metal layer with metal lines 20, 22 and 24. In addition, bottom layer components and connections include power rail 46, ground rail 48 and connections 50. Connection 50 forms a bottom output that connects to the gate 38 on a bottom side. In addition, connection line 24 forms a top output that connects to the gate structure 38 on a top side. This provides both a top and bottom output in a same chip area. The top and bottom outputs may be connected together or connected to different locations. The top and bottom outputs are shown in greater detail in FIGS. 3 and 4.

Referring to FIG. 3, a cross-sectional view taken at section line XC1 of FIG. 1 is shown in accordance with one illustrative embodiment. Vertical FETs 16 and 18 include fins 32 and 28. Vertical FET 16 includes S/D regions 52 and 62 disposed vertically relative to the fin 32. The gate structure 36 surrounds the fin portion 32. The fin portion 32 forms a channel for the FET 16. Vertical FET 18 includes S/D regions 54 and 64 disposed vertically relative to the fin 28. The gate structure 36 surrounds the fin portion 28. The fin portion 28 forms a channel for the FET 18. FETs 16 and 18 have connections that can be top connections 72 or bottom connections 70. The top connections 72 include gate contact 42, which connects to input B (line 22) and contact 58, which connects a top output 24 with S/D region 54. The bottom connections 70 include a contact 57, which connects to ground rail 48 to S/D region 64, and a contact 57 that connects a bottom output (line 50) with S/D region 62. The supply rail 46 is also present in the bottom connections 70 but is not connected to components in this view.

Referring to FIG. 4, a cross-sectional view taken at section line XC2 of FIG. 1 is shown in accordance with one illustrative embodiment. Fin portion 35 connects with S/D regions 55 and 63 disposed vertically relative to the fin 35. The gate structure 38 surrounds the fin portion 35. The fin portion 35 forms a FET channel, but the S/D regions 55 and 63 have no connections. Fin portion 37 connects with S/D regions 53 and 65 disposed vertically relative to the fin 37. The gate structure 38 surrounds the fin portion 37. The fin portion 37 forms a FET channel, but the S/D regions 53 and 65 have no connections.

The top connections 72 include gate contact 40, which connects to the top output (line 24). The bottom connections 70 include a contact 59, which connects to the bottom output (line 50). The ground rail 48 and the supply rail 46 are also present in the bottom connections 70 but are not connected to components in this view. The gate 38 can be activated be either the top connections 72 or the bottom connections 70 (or both). Similar top and bottom access can be provided to any components described in accordance with the present embodiments, e.g., VFETs, metal lines, etc.

Figure 5:
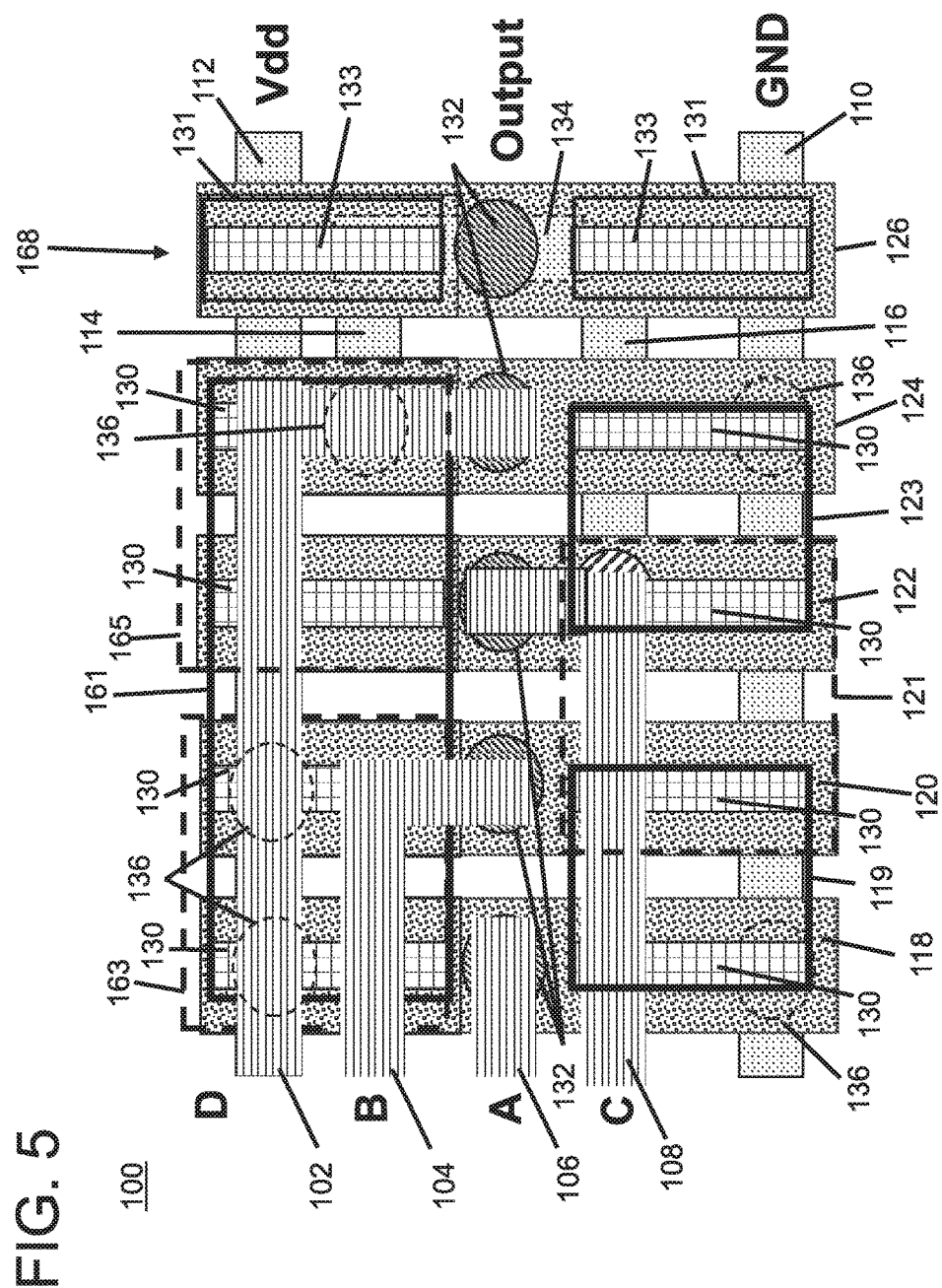
FIG. 5 is a layout view showing a five-track AND/OR invert (AOI) gate device having top and bottom connections and supply and ground rails formed below vertical transistors in accordance with an embodiment of the present invention.
Figure 6:
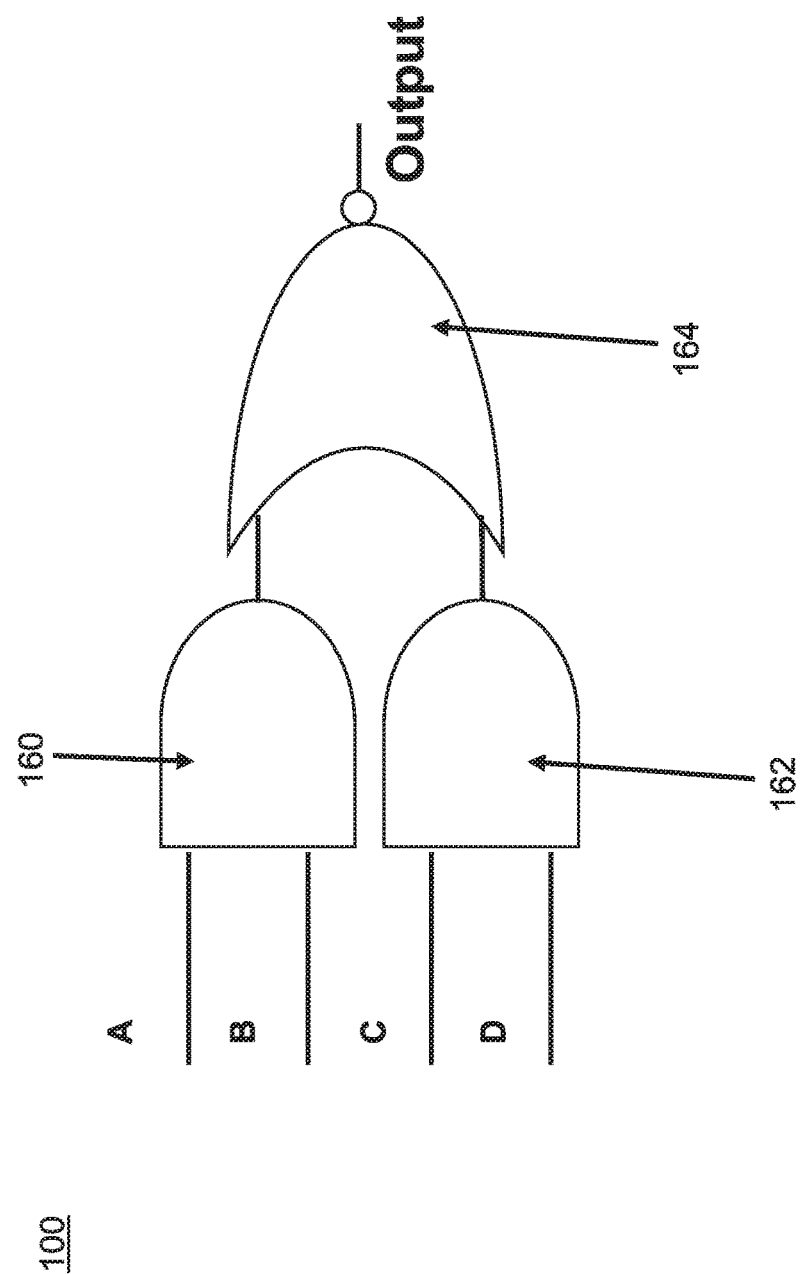
FIG. 6 is a schematic diagram showing the AOI gate circuit of the device in FIG. 5 in accordance with an embodiment of the present invention.

Referring to FIGS. 5 and 6, an illustrative layout 100 of a 2-2 AND/OR invert (AOI) gate (AOI22) is depicted to show top and bottom connections to components in a semiconductor layout. It should be understood that some components are transparent or depicted as dashed in order to provide clarity. The layout 100 includes two AND gates 160 and 162 and one NOR gate 164. AND gates 160 and 162 and NOR gate 164 include field effect transistors (FETs) represented by fins 130, which include vertical finFETs in this example. The FETs include a vertical channel formed in fins 130. The fins 130 include top S/D regions 161, 119 and 123, which are above the device (transparent), and S/D regions 163, 165 and 121, which are below the device (dashed lines). Fins 133 in portion 168 are not employed in the AOI gate, but include S/D regions 131, etc., which are concurrently formed with other components.

Gate structures 118, 120, 122, 124 and 126 are formed about the fins 130. The gate structures 118, 120, 122, 124 and 126 are activated through gate contacts 132. The gate contacts 132 are connected to top metal lines 102, 104, 106 and 108. The top metal lines 102, 104, 106 and 108 and contacts 132 are included in top connections (above the VFETs (fins 130)). Metal line 102 forms an input D for the AND gate 162. Metal line 104 forms an input B for the AND gate 160. Metal line 106 forms an input A for the AND gate 160. Metal line 108 forms an input C for the AND gate 162. The AND gates 160 and 162 and the NOR gate 164 can connect through bottom connections 114, 116, 134 (and bottom contacts 136), which are formed below the VFETs (fins 130) or through top connections or gates structures. Supply rail (Vdd) 112 and ground rail (GND) 110 are provided as bottom connections below the fins 130. By forming the bottom connections, greater chip area can be achieved and device thicknesses can be maintained. Having metal layers above and below the vertical FETs results in metal connections being closer and permitting the use of the additional height to increase metal line heights to reduce resistance.

The layout 100 includes another 5-track layout. The 5-track layout efficiently realizes an entire 2-2 AOI gate by taking advantage of both top and bottom connection layers. The five tracks include inputs D, B, A, C and ground rail 110. Output "Output" can be formed in a top metal layer and a bottom metal layer. This provides both a top and bottom output in a same chip area. The top and bottom outputs (gate contacts) may be connected together or connected to different locations. The gates can be activated be either the top connections or the bottom connections (or both). Similar top and bottom access can be provided to any components described in accordance with the present embodiments, e.g., VFETs, metal lines, etc.

While the present embodiments are illustratively depicted as 5-track layouts, other numbers of tracks are contemplated with the use of the top and bottom connections. In addition, different wiring configurations and device structures can also be employed. The bottom connections may be employed in a number of configurations including forming metal lines in a semiconductor substrate or on the semiconductor substrate after portions of the substrate are removed. In other embodiments, metal lines can be connected to metal bumps or connections on a back side of a substrate. While the present embodiments include a NOR2 gates and AOI22 gate, any gate or device can be employed and benefit from the use of metallization above and below a substrate material or FET layer.

Referring to FIGS. 7A-7C, an illustrative fabrication sequence shows one method for forming top and bottom connections for vertical transistors. In FIG. 7A, a semiconductor substrate 170 can include any suitable substrate material, such as, e.g., Si, SiGe, SiC, silicon-on-insulator, III-V materials, etc. In one or more embodiments, fins 182 are grown from the substrate 170 to form a bottom S/D region 178, a channel region 176 and a top S/D region 174. The bottom S/D region 178 may be formed in the substrate 170 before the fin 182 is grown. The top S/D region 174 can be formed after the fin 182 is grown in an additional epitaxial growth process. A dielectric layer 172, such as a silicon oxide, can be formed, and a trench etched in the dielectric layer 172, using lithography or the like, to grow the fins 182 therein. It should be understood that any number of methods may be employed to form the fins and the vertical transistors from the substrate 170, and any number of methods may be employed to grow or form the S/D regions 178, 174.

In FIG. 7B, a gate structure 180 is formed about channel regions 176. The gate structure 180 can include a gate dielectric layer with one or more dielectric layers and can be formed on the channel region 176 of the vertical fin 182. The gate structure 180 further includes a gate electrode or gate conductor that includes a metal or other highly conductive material and surrounds (fully or partially) the vertical fin 182 or channel 176. The gate electrode is formed by forming a trench in the dielectric layer 172. The dielectric material is later restored and planarized to a desired height. A (bottom) gate contact 184 is formed down to the gate electrode.

Additional dielectric material 192 is deposited and trenches formed for developing bottom connections. The bottom connections include supply voltage lines 188 (Vdd), ground voltage lines 186 (GND) and other bottom connections including output lines 190.

In FIG. 7C, the substrate 170 is removed by etching or other process (e.g., mechanical processes), and the device is flipped to continue processing. The continued processing includes forming top connections. This includes depositing dielectric layers 194, 196 and forming contacts 198 and an output contact 199. The dielectric layers 194, 196 can include oxides or other suitable materials. Top and bottom connections to VFETs are realized in this way. In addition, top and bottom connections to other components are also achieved. In this example, the gate structure 180 has top and bottom connections (198, 184) for top and bottom outputs 199, 190. It should be understood that many additional top or bottom metal layers may be provided other than those depicted in FIGS. 7B and 7C.

It should also be understood that the devices 182 depicted in FIG. 7A-7C are illustrative. Other vertical FET designs and configurations may be employed. In addition, vertical nanowires or other vertically devices may also be employed. FIG. 7C illustratively shows two VFETs; however, any device, combinatorial logic elements, sequential logic elements, etc. can be provided. The present embodiments are applicable to any device where channel current is in the vertical direction. This can include vertical transport fin-FETs, vertical gate complementary metal oxide semiconductor (CMOS) FETs, vertical nanowire devices, etc. In addition, the gate structures are formed in a plane with one or more fin structures to create a domain boundary between above and below metal or contact regions.

Figure 8:
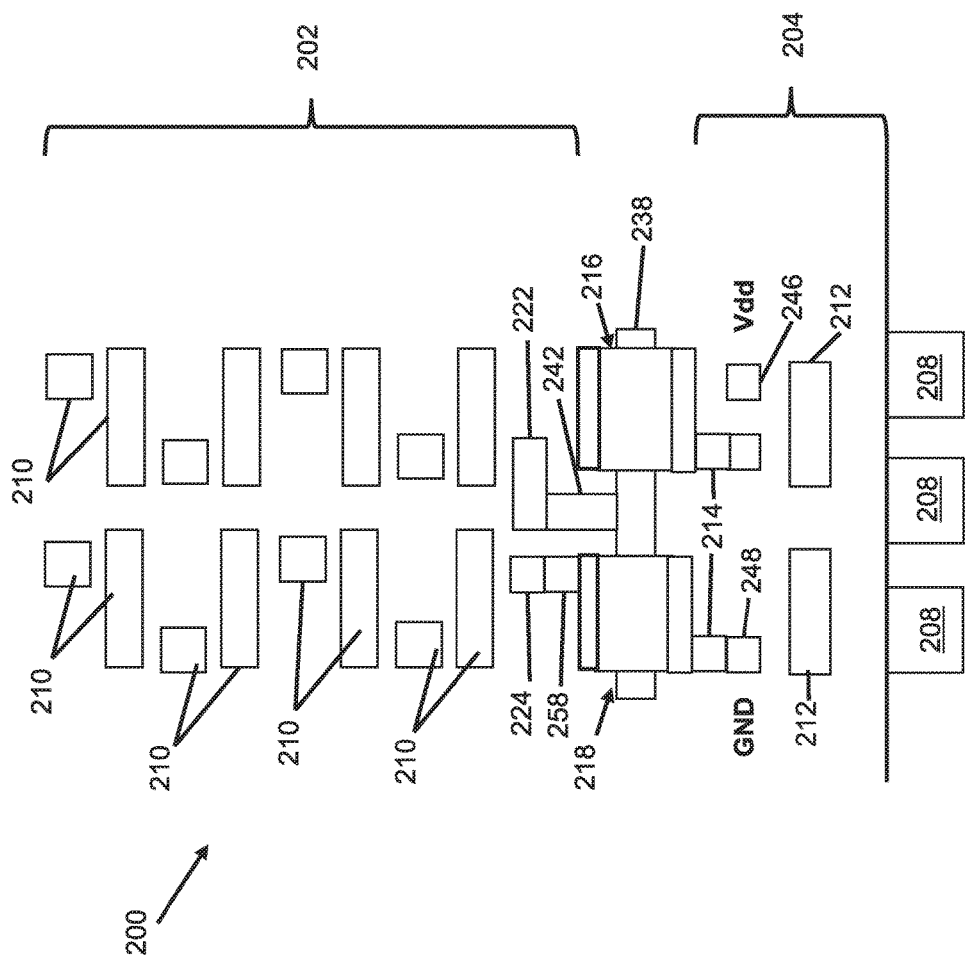
FIG. 8 is a schematic cross-sectional view showing top and bottom connections of a semiconductor device and showing bottom connections connecting to conductive bumps that extend from a back surface of the device in accordance with an embodiment of the present invention.

Referring to FIG. 8, an illustrative cross-sectional view is shown for a device 200 having top connections 202 and bottom connections 204 in accordance with embodiments of the present invention. The far end of the line wiring 202 can be dedicated to logic interconnections. In this way, connections 224, 222 can be connected to devices on or off chip through metal lines 210 and vias or contacts (e.g., contacts 258, 242) on top side of the VFETs 216 and 218. A gate 238 is connected to an output lines 222 by a contact 242 on the top side. Other contacts 258 can be employed to connect the VFETs to the metal line 224.

Bottom connections 204 include back end of the line (BEOL) metal structures that include a few levels for power rails 246, ground rails 248, which connect to VFETs 216 and 218 through contacts 214. Metal lines 212 can be employed to connect components to conductive bumps 208, which can be formed on a back side 206 of the device or substrate. Bumps 208 can protrude out of the backside 206 to permit connections to, e.g., GND lines 248 and Vdd lines 246. The placement of bottom connections and components avoids power and ground signal wiring at the far end of the line (top connections 202) and, in turn, reduces capacitance and permits a reduced total number of metal levels.

Figure 9:
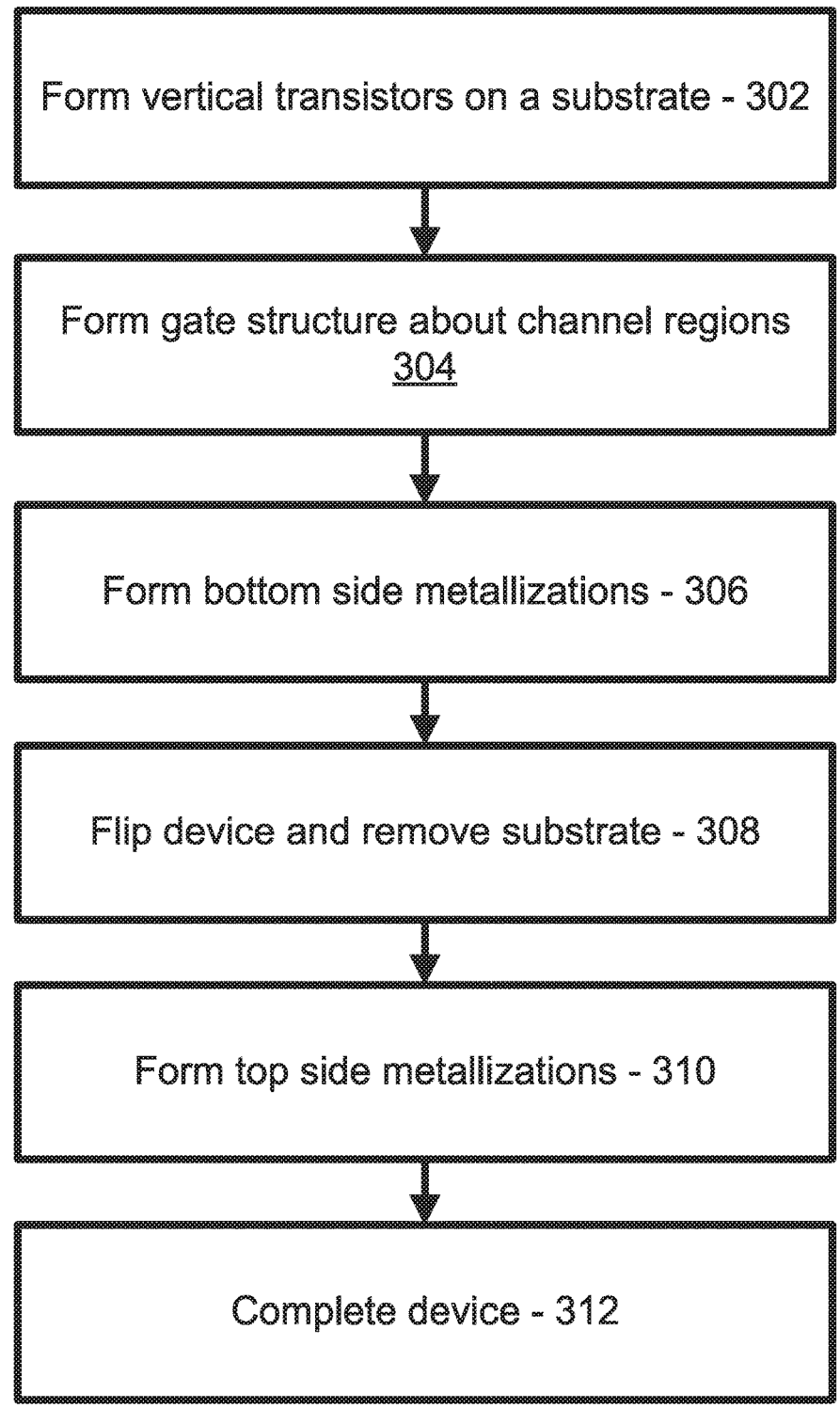
FIG. 9 is a block/flow diagram showing methods for forming a semiconductor device with top and bottom connection in accordance with embodiments of the present invention.

Referring to FIG. 9, a method for forming a semiconductor device is illustratively shown. In block 302, vertical transistors are formed on a substrate. The vertical transistors may be formed by epitaxially growing fins through a patterned trench in a dielectric layer. The vertical transistors include a channel region sandwiched between S/D regions above and below the channel region in a vertical orientation. The vertical transistors form a plane to provide a top side region above the plane and a bottom side below the plane. In block 304, a gate structure is formed disposed about the channel regions of the vertical transistors. In one embodiment, the vertical transistors can share a same gate structure.

In block 306, bottom side metallization structures are formed having at least one connection to the vertical transistor on a bottom side. The bottom side metallization structures can include a power rail and a ground rail. The bottom side metallization structures include interlevel dielectric layers, contacts and metal lines.

In block 308, the substrate is removed from the vertical transistors to provide access to the other side of the vertical transistors. The substrate can be removed using an etch process, a chemical mechanical polish (CMP) or other process.

In block 310, top side metallization structures are formed after the device is flipped over. The top side metallization structures include at least one connection to the vertical transistors on a top side. The bottom side metallization structures include interlevel dielectric layers, contacts and metal lines. In a particularly useful embodiment, the gate structure is contacted on the top side and the bottom side by gate contacts. Two or more gate contacts may be employed. In one embodiment, the gate contacts can be formed on opposite sides of a same gate structure, e.g., on the top side and the bottom side. In addition, the vertical transistors can be contacted on the top side and the bottom side. In one embodiment, the top side can include far end of the line structures and the bottom side can include back end of the line (BEOL) structures. In block 312, processing continues to complete the device.

Having described preferred embodiments for 3D vertical FET with top and bottom gate contacts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    forming a vertical transistor on a substrate;
    forming a gate structure disposed about a channel region of the vertical transistor, the vertical transistor having a top side and a bottom side;
    forming bottom side metallization structures having at least one connection to the vertical transistor on a bottom side, the bottom side metallization structures including a power rail and a ground rail;
    after forming the bottom side metallization structures, removing the substrate and flipping the vertical transistor; and
    forming top side metallization structures, the top side metallization structures having at least one connection to the vertical transistor on the top side.

2. The method as recited in claim 1, wherein the gate structure is contacted on the top side and the bottom side by gate contacts.

3. The method as recited in claim 1, wherein the gate contacts are formed on opposite sides of a same gate structure on the top side and the bottom side.

4. The method as recited in claim 1, wherein the vertical transistor is contacted on the top side and the bottom side.

5. The method as recited in claim 1, wherein the top side includes far end of the line structures and the bottom side includes back end of the line (BEOL) structures.

6. The method as recited in claim 1, wherein forming the top side metallization structures includes forming the top side metallization structures having at least one connection to the vertical transistor on the top side.

7. The method as recited in claim 1, further comprising forming gate contacts to the gate structure on the top side and the bottom side.

8. The method as recited in claim 1, wherein the vertical transistor is a part of a logic device and the logic device connects to the metallization structures on the top side and the bottom side.

9. The method as recited in claim 8, wherein the logic device includes a logic device from a five track cell library.

10. The method as recited in claim 1, further comprising forming gate contacts to the gate structure on the top side and the bottom side.

11. A method for forming a semiconductor device, comprising:
    forming a vertical transistor on a substrate;
    forming a gate structure disposed about a channel region of the vertical transistor, the vertical transistor having a top side and a bottom side;
    forming bottom side metallization structures having at least one connection to the vertical transistor on the bottom side;
    after forming the bottom side metallization structures, removing the substrate and flipping the vertical transistor; and
    forming top side metallization structures.

12. The method as recited in claim 11, wherein the gate structure is contacted on the top side and the bottom side by gate contacts.

13. The method as recited in claim 11, wherein the gate contacts are formed on opposite sides of a same gate structure on the top side and the bottom side.

14. The method as recited in claim 11, wherein the vertical transistor is contacted on the top side and the bottom side.

15. The method as recited in claim 11, wherein the top side includes far end of the line structures and the bottom side includes back end of the line (BEOL) structures.

16. The method as recited in claim 11, wherein forming the top side metallization structures includes forming the top side metallization structures having at least one connection to the vertical transistor on the top side.

17. The method as recited in claim 11, further comprising forming gate contacts to the gate structure on the top side and the bottom side.

18. The method as recited in claim 17, wherein the gate contacts are formed on opposite sides of a same gate structure on the top side and the bottom side.

19. The method as recited in claim 11, wherein the vertical transistor is a part of a logic device and the logic device connects to the metallization structures on the top side and the bottom side.

20. The method as recited in claim 19, wherein the logic device includes a logic device from a five track cell library.

* * * * *